March 30, 1965 R. R. PIERCE 3,176,229

RADIO RESCUE BEACON

Filed Nov. 7, 1962 2 Sheets-Sheet 1

Inventor
Reginald R. Pierce

By

Atty.

Inventor
Reginald R. Pierce
By G. H. Emery
Atty.

3,176,229
RADIO RESCUE BEACON
Reginald R. Pierce, Sidcup, Kent, England
(Riversite Buildings, Erith, Kent, England)
Filed Nov. 7, 1962, Ser. No. 236,076
Claims priority, application Great Britain, Nov. 9, 1961, 40,225/61
4 Claims. (Cl. 325—105)

The invention relates to a transmitter suitable for use in a battery operated rescue beacon operating in the ultra high frequency (UHF) band, and employing semiconductor devices throughout to permit economy in battery power.

The international UHF distress frequency at present is 243 mc./s.; therefore any beacon is required to radiate power at this frequency. At the present stage of development silicon transistors capable of any power output are operating more or less at the limits of their capabilities at this frequency.

As the frequency of radiated power is required to be crystal controlled, the radio frequency (R.F.) circuits in any practical system must start by generating some intermediate frequency in a crystal controlled oscillator and produce the required 243 mc./s. output by amplifying and frequency doubling stages. 60 mc./s. is a suitable starting frequency, being chosen as the highest usable crystal frequency which does not call for unduly fragile and inactive crystals.

Now such a system using transistors entirely and producing approximately 0.5 watt at 243 mc./s. must employ many devices and, therefore, be expensive to manufacture and uneconomical electrically, due to the inefficiency of transistors as frequency doublers and the fall off in gain as the frequency of operation is increased.

The solution adopted in accordance with the invention is to operate the transistors at a frequency which is low by comparison with their cut off frequency to obtain the power required and then to multiply the frequency up to the required value in some circuit, without of necessity obtaining any gain during this multiplication. A suitable multiplying device is the variable capacitance diode. This semiconductor device has the property of presenting a junction capacity whose value varies in a non-linear fashion to the reverse voltage applied across it. As the capacitance/voltage relationship is non-linear it can be used in a harmonic generator circuit to produce frequency multiplication. If the diode chosen has a low loss resistance it can be made to multiply quite efficiently, albeit without gain.

Variable-capacitance diodes designed for use of multipliers are now available commercially.

In any rescue beacon maximum efficiency of all circuits is called for to ensure the longest possible battery life. With this in mind some form of pulsing of the R.F. carrier wave is desirable. However, to make the system compatible with present search equipment in service, the period of each R.F. pulse must be at least 0.5 sec. From experience it has been found that a pulse repetition period of 3–4 secs. is suitable to give the signal required to operate the visual indicators in current use in the search aircraft. However, to allow the distress signal to be picked up aurally on a normal aircraft receiver some form of modulation is required. Having regard to the noise suppression circuits used on many service aircraft equipments the modulation should have a frequency of 1 kc./s. and be as deep as possible.

These conditions can conveniently be met in a transmitter in accordance with the invention with economy in components and consumption by the use of a transistor oscillator D.C.–D.C. converter to provide the supplies to the oscillator, amplifier and multiplier stages of the transmitter and also, by the use of unsmoothed rectifier in the output of the converter, to effect a high modulation of the transmitted signal.

Especially favourable results can be obtained if the transistor converter is of the push-pull type and is to operate with one transistor conducting substantially more of each period of oscillation than the other, using a half-wave rectifier to supply the later stages of the transmitter while the longer duty transistor is operating. With a saturating core transformer type of converter the output wave form with a half-wave unsmoothed rectifier will be pulsed at the frequency of operation of the transistor oscillator, the supply being "on" for the greater part of each cycle.

Normally 100 percent square wave modulation reduces the mean power of a transmission of a given peak amplitude to half that peak. By the asymmetric operation of a converter/modulator arrangement this mean power can be more than half the peak power without losing the advantages of high percentage, angular waveform, modulation.

In order to reduce the drain on the battery, the power output is preferably pulsed in such a way that there is, say, a half second burst of power in every three seconds.

If the beacon transmissions are to be pulsed "on" and "off" this can very easily be effected by the use of a transistor switch to turn the oscillator transistors of the converter "on" and "off." The switch can conveniently be controlled by a transistor multivibrator.

In order that the invention may be thoroughly understood a rescue beacon incorporating a transmitter in accordance with it will be described in some detail, by way of example, with reference to the accompanying drawings, in which.

Figure 1:
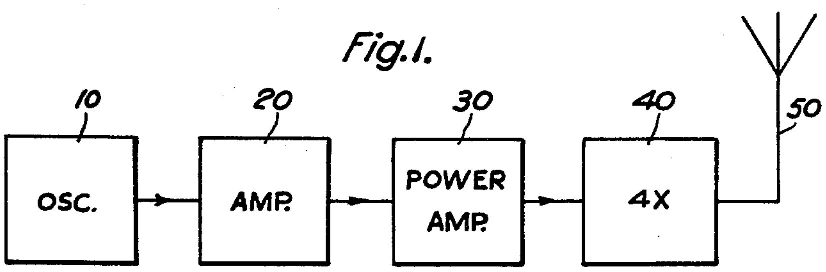
FIGURE 1 is a block schematic diagram of the transmitter.

As shown by the block diagram of FIGURE 1 the transmitter proper is comprised by four stages; a crystal controlled oscillator 10 tuned to operate at 60 mc./s. and to deliver 60 mw. of power; an intermediate amplifier stage arranged to deliver 120 mw. to; a power amplifier 30 designed to deliver a power of 1 w. at 60 mc./s. to; a fourth harmonic multiplier stage 40 employing a variable capacitance diode. The multiplier stage 40 delivers about 0.5 w. at 243 mc./s. to aerial 50.

Figures 2, 3:
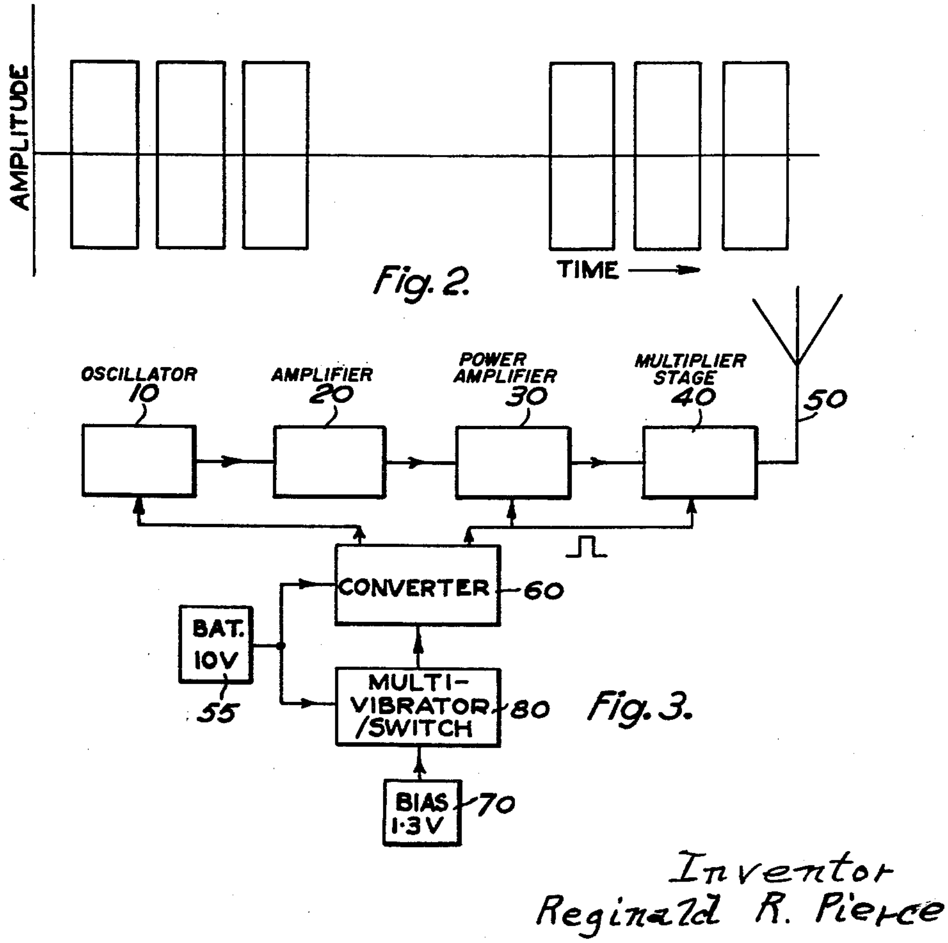
FIGURE 2 shows the envelope of the wave form transmitted by the beacon.
FIGURE 3 is a block schematic diagram of the whole beacon.

This transmitter is incorporated in a beacon arranged in the manner outlined above to give a square wave modulated and pulsed output. The envelope of the transmitted wave form is illustrated in FIGURE 2. The object of this type of wave form for modulation is to maintain a high mean power while still providing a good depth of modulation of the R.F. output. In the beacon described the load takes power for three-quarters of each cycle which means that the mean power is reduced to 0.75 of the unmodulated carrier power. The repetition frequency of the modulation is chosen to be 1 kc./s. but due to the unsymmetrical mode of its application the load takes power for a greater part of the cycle than the normal half-cycle.

The last stage 30 of the amplifier chain in the transmitter shown in FIGURE 1, runs more efficiently at a high voltage, 30 volts say, whereas the first two stages 10 and 20 run best at comparatively low voltages, say 10 to 12 volts.

The two power supplies are both derived from a single converter, and by switching the latter "on" and "off" the transmitted R.F. carrier is pulsed.

The complete system is shown schematically in FIGURE 3. The beacon shown in FIGURE 3 can be very economical while maintaining a relatively high output power for such a system.

In the system illustrated by FIGURE 3 the amplifier stages are supplied with power at two different voltages, the higher of which is square wave amplitude modulated by a saturating core push-pull oscillator converter 60 supplied from a 10 v. battery 55. Both outputs from converter 60 are rectified but only the lower voltage output is smoothed. The converter is unsymmetrically arranged in the manner described above so as to apply the required form of modulation to the output of the transmitter.

The oscillator of the converter 60 is switched "on" and "off" so that the transmitted output may be pulsed as well as modulated, by using a 1.3 v. bias battery 70 to switch off the two transistors used in the oscillator of the converter 60 and by switching them on again by overcoming this bias voltage by means of a reverse voltage developed across a resistor in the base circuit of a switching transistor. The timing sequence to switch that switching transistor "on" and "off" is derived from a standard multivibrator. The switching transistor and the multivibrator circuit are represented by the block 80 in FIGURE 3.

Figure 4:
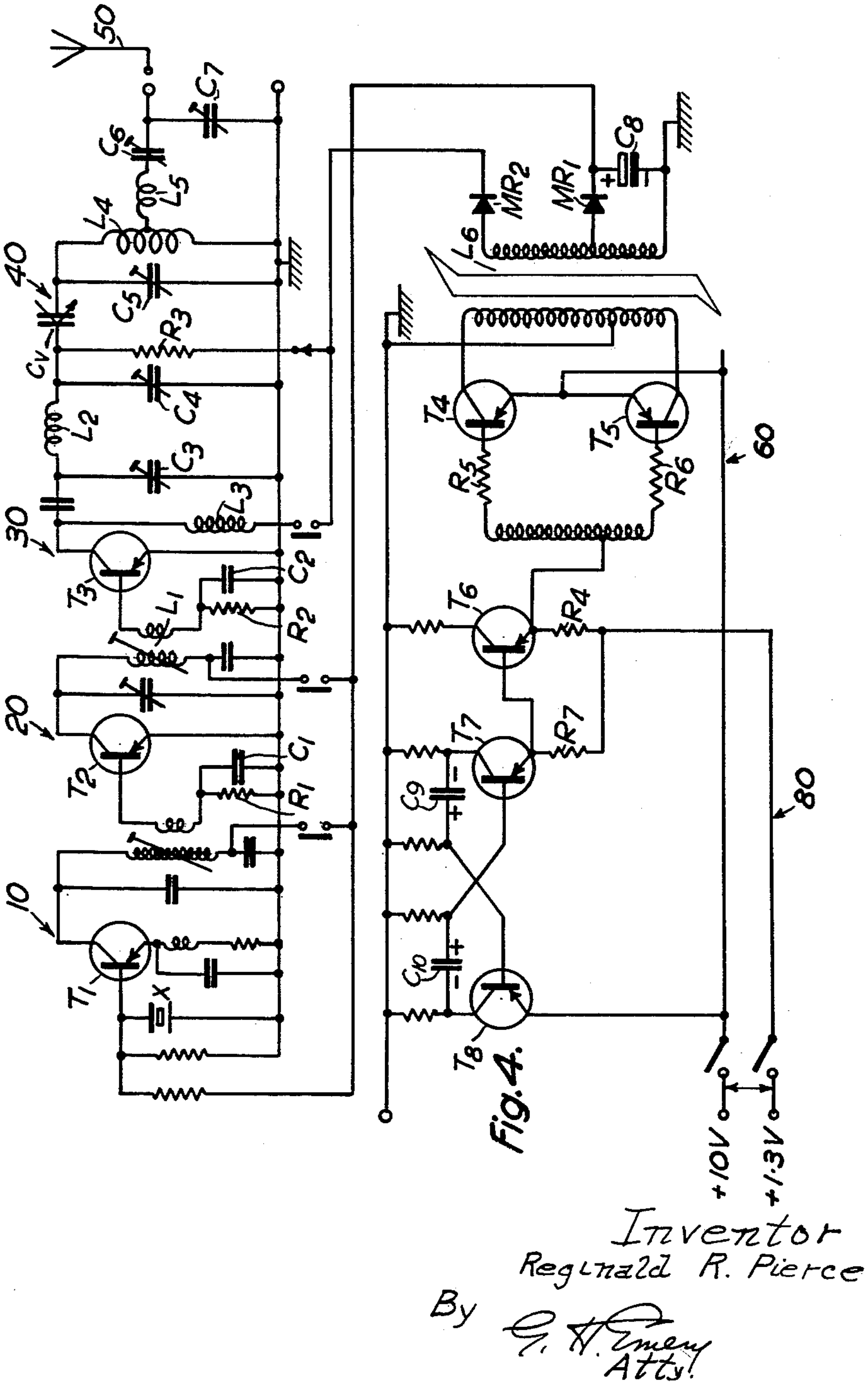
FIGURE 4 is a circuit diagram of the beacon.

The actual circuit is shown in FIGURE 4.

The output frequency of the transmitter is crystal controlled and derived from the 60 mc./s. oscillator circuit 10. In this circuit the transistor $T_1$ operates as a grounded emitter oscillator, the frequency of oscillation being controlled by a 60 mc./s. third overtone series resonance crystal X.

Output from the oscillator stage 10 is inductively coupled to the base of the transistor $T_2$ in the intermediate amplifier 20 operating in class C. Self-bias is developed across the resistor/capacitor network $R_1C_1$. This stage is driven hard by the oscillator 10 but the output is kept down to the order of 120 mw. Taking less than the maximum possible output from this circuit tends to help the drive to the following stage to remain constant regardless of the variations in gain of the transistors $T_1$ and $T_2$ used in the two stages 10 and 20.

The output from the intermediate amplifier 20 is coupled from the collector circuit of the transistor $T_2$ into the base of a transistor $T_3$ in the power amplifier stage 30 by a single tuned transformer $L_1$. Again self-bias is obtained across a resistor/capacitor network, $R_2C_2$. The transistor $T_3$ is arranged to operate as a class C amplifier and the power output is taken by way of a "pi" output matching network $C_3L_2C_4$. The 30 v. supply for the transistor $T_3$ is applied from the converter 60 through a R.F. choke $L_3$. The collector load of the transistor $T_3$ is arranged to give an average output of 1 watt into the following multiplier stage 40.

The multiplier 40 uses a voltage variable capacitor CV in series configuration, reverse bias being obtained from the 30 v. supply through a resistor $R_3$. The 243 mc./s. fourth harmonic output from CV is developed across the tuned circuit $C_5L_4$ and the aerial matched into this by the harmonic rejection circuit $L_5C_6C_7$.

There are two power supplies for the R.F. strip 10, 20, 30, 40 of the transmitter. The first, for the oscillator 10 and the intermediate amplifier 20, and 12 v., is obtained by rectifying and smoothing part of the output from the transformer $L_6$ of the modulator converter oscillator 60 by means of the metal rectifier $MR_1$ and a capacitor $C_8$. The second comes from the same converter 60 but at 30 v., being rectified by the metal rectifier $MR_2$ but unsmoothed, supplies power to the amplifier 30 and the multiplier circuit 40, and at the same time amplitude modulates the output to the aerial 50.

The modulator/converter 60 differs from a standard D.C.–D.C. converter in that the primary winding of the converter transformer $L_6$ which forms the load for the collectors of the push-pull transistors $T_4$ and $T_5$ is not tapped at its centre but unsymmetrically, and in that the connections of the rectifiers $MR_1$ and $MR_2$ are such that the load current flows only through the transistor $T_4$ thus giving the required unsymmetrical output waveform.

In order to control the oscillation of the push-pull converter 60, reverse bias is applied to the base-emitter junction of the transistors $T_4$ and $T_5$ from the bias battery 70 (FIGURE 3). The converter circuit 60 will only oscillate when this bias voltage is overcome by a reverse voltage developed across a resistor $R_4$ in the emitter circuit of a switching transistor $T_6$ in the timing circuit beacon. Thus, when the transistor $T_6$ is switched "on" and bottoms the circuit 60 behaves as a normal D.C.-D.C. converter.

The timing of the switching of the converter is determined by a multivibrator circuit using two transistors $T_7$ and $T_8$ in which the values of the timing capacitors $C_9$ and $C_{10}$ are selected to give switching times of 0.65 sec. "on" and 2.85 sec. "off" in a pulse repetition time of 3.5 sec. The transistor $T_7$ conducts for the shorter period and part of the emitter current is used to switch the transistor $T_6$, and thus the converter 60, "on." The resistor $R_7$ in the base circuit of the transistor $T_7$ is returned to the positive terminal of the 1.3 v. bias battery 70 rather than to the positive 10 v. supply, since otherwise, positive bias would be applied to the emitter of the transistor $T_6$ with respect to its base and it would be switched "on" all the time.

The resistors $R_5$ and $R_6$ shown in the base circuits of the transistors $T_4$ and $T_5$ serve as current limiting resistors and help to maintain a constant output from the converter 60 regardless of changes in input impedance.

All semi-conductor devices other than the push-pull pair of transistors $T_4$ and $T_5$ in the oscillator of the converter 60 are silicon in order to simplify operation over a wide temperature range.

I claim:

1. A battery operated radio rescue beacon employing semiconductor devices as the sole active elements, comprising: a semiconductor crystal controlled radio frequency oscillator; a semiconductor amplifier connected to receive and amplify oscillations from the said oscillator; and a frequency multiplier stage connected to receive amplified oscillations from the said amplifier, the said stage including a semiconductor voltage variable capacity diode connected to a source of reverse bias, and further including a circuit tuned to a multiple of the frequency of the said oscillations, across which the output from the said diode is developed at a frequency which is the said multiple of that of the oscillations received by the stage, the said stages comprising a transmitter; an antenna; and a transistor oscillator D.C.–D.C. converter of the push-pull transformer type connected to provide the power supplies to at least the last two stages of the said transmitter, the said converter including an unsmoothed rectifier in the output thereof, whereby to effect a high modulation of the transmitter signal, the said converter being arranged to operate with one transistor conducting for substantially more of each period of oscillation than the other, the said rectifier being connected so as to supply the said transmitter stages while the longer duty transistor is operating.

2. A battery operated radio rescue beacon according to claim 1, further including a transistor switch connected to turn the oscillator transistors of the converter "on" and "off," and a transistor multivibrator circuit connected to control the said switch in a repetitive cycle.

3. A battery operated radio rescue beacon according to claim 1, in which the oscillator stage and a first amplifier stage of the said transmitter are connected to receive power from the said converter at a lower voltage than that supplied to the said last two stages, a separate rectifier and smoothing capacitor being included in the said converter for the purpose.

4. A battery operated radio rescue beacon according to claim 1, further including a transistor switch connected to turn the oscillator transistors of the converter "on" and "off," and a transistor multivibrator circuit connected to control the said switch in a repetitive cycle, and in which the said multivibrator is arranged to switch the said switch, and thus the said converter, "on" for 0.65 sec. in a pulse repetition period of 3.5 sec.

References Cited by the Examiner

UNITED STATES PATENTS

| | | | |
|---|---|---|---|
| 3,048,764 | 8/62 | Murphy | 325—105 |
| 3,068,415 | 12/62 | Johnson | 325—104 |
| 3,108,223 | 10/63 | Hunter | 325—105 |

OTHER REFERENCES

Homer: Electronic Industries and Tele-Tech., vol. 16, October 1957, pp. 5–7 and 14–16.

DAVID G. REDINBAUGH, *Primary Examiner*.